(12) United States Patent
De et al.

(10) Patent No.: US 8,926,758 B2
(45) Date of Patent: Jan. 6, 2015

(54) COMPOSITION AND METHOD FOR REMOVING PHOTORESIST AND BOTTOM ANTI-REFLECTIVE COATING FOR A SEMICONDUCTOR SUBSTRATE

(71) Applicant: Intermolecular Inc., San Jose, CA (US)

(72) Inventors: Indranil De, Mountain View, CA (US); Anh Duong, Fremont, CA (US)

(73) Assignee: Intermolecular, Inc., San Jose, CA (US)

( * ) Notice: Subject to any disclaimer, the term of this patent is extended or adjusted under 35 U.S.C. 154(b) by 158 days.

(21) Appl. No.: 13/779,277

(22) Filed: Feb. 27, 2013

(65) Prior Publication Data
US 2013/0167867 A1 Jul. 4, 2013

Related U.S. Application Data

(63) Continuation of application No. 12/970,421, filed on Dec. 16, 2010, now Pat. No. 8,449,681.

(51) Int. Cl.
| | |
|---|---|
| C11D 7/50 | (2006.01) |
| G03F 7/32 | (2006.01) |
| C11D 7/32 | (2006.01) |
| G03F 7/42 | (2006.01) |
| C11D 11/00 | (2006.01) |
| H01L 21/02 | (2006.01) |

(52) U.S. Cl.
CPC ............ *G03F 7/327* (2013.01); *C11D 7/3209* (2013.01); *C11D 7/5009* (2013.01); *C11D 7/5013* (2013.01); *C11D 7/5022* (2013.01); *G03F 7/425* (2013.01); *C11D 11/0047* (2013.01); *H01L 21/02052* (2013.01)
USPC .............................. 134/1.3; 510/175; 510/176

(58) Field of Classification Search
CPC .................................................... C11D 11/0047
USPC .................................. 510/175, 176; 134/1.3
See application file for complete search history.

(56) References Cited

U.S. PATENT DOCUMENTS

| | | | | |
|---|---|---|---|---|
| 8,449,681 | B2 * | 5/2013 | Duong et al. | 134/1.3 |
| 8,835,212 | B2 * | 9/2014 | Avachat | 438/86 |
| 2006/0108320 | A1 * | 5/2006 | Lazovsky et al. | 216/2 |
| 2007/0202610 | A1 * | 8/2007 | Chiang et al. | 436/518 |
| 2010/0175715 | A1 * | 7/2010 | Kumar et al. | 134/3 |
| 2013/0157897 | A1 * | 6/2013 | Francis et al. | 506/13 |
| 2014/0057371 | A1 * | 2/2014 | Foster | 438/14 |
| 2014/0070213 | A1 * | 3/2014 | Boussie et al. | 257/48 |

* cited by examiner

*Primary Examiner* — Gregory Webb

(57) ABSTRACT

A composition for removing photoresist and bottom anti-reflective coating from a semiconductor substrate is disclosed. The composition may comprise a nontoxic solvent, the nontoxic solvent having a flash point above 80 degrees Celsius and being capable of dissolving acrylic polymer and phenolic polymer. The composition may further comprise Tetramethylammonium Hydroxide (TMAH) mixed with the nontoxic solvent.

17 Claims, 2 Drawing Sheets

COMPOSITION AND METHOD FOR REMOVING PHOTORESIST AND BOTTOM ANTI-REFLECTIVE COATING FOR A SEMICONDUCTOR SUBSTRATE

CROSS-REFERENCE TO RELATED APPLICATIONS

This is a Continuation Application of U.S. patent application Ser. No. 12/970,421, filed on Dec. 16, 2010, which is herein incorporated by reference for all purposes.

TECHNICAL FIELD

The present invention relates to the field of resist-removing solutions and particularly to a composition and method for removing photoresist and bottom anti-reflective coating for a semiconductor substrate.

BACKGROUND

Semiconductor device fabrication is the process used to create integrated circuits that are present in electrical and electronic devices. The fabrication process includes a sequence of photographic and chemical processing steps during which electronic circuits are gradually created on a substrate made of semiconductor materials. A typical substrate is made out of silicon, and is sliced and polished to obtain a regular and flat surface.

Once the substrate is prepared, many process steps are necessary to produce the desired semiconductor integrated circuit. Such steps can be grouped into two major parts: Front End Of Line (FEOL) processing and Back End Of Line (BEOL) processing. FEOL processing refers to the formation of the transistors directly in the silicon. In FEOL processing, a semiconductor substrate is developed by the growth of an ultrapure, virtually defect-free silicon layer through epitaxy. Additional steps performed in the FEOL process include: growth of the gate dielectric (traditionally silicon dioxide), patterning of the gate, patterning of the source and drain regions, and subsequent implantation or diffusion of dopants to obtain the desired complementary electrical properties.

Patterning refers to a series of steps that form or alter the existing shape of the deposited materials on the substrate. During patterning, the substrate is coated with a layer of photoresist. The photoresist is then exposed to a pattern of intense light, and the areas of the photoresist that are exposed to the intense light become soluble in a developer solution. A layer of anti-reflective coating may be utilized to reduce reflections during the exposure. The anti-reflective coating may be located at the bottom of the photoresist, and may be referred to as the bottom anti-reflective coating (BARC) layer. After the exposure, the developer solution is utilized to remove the exposed photoresist, and the remaining photoresist is solidified to form a protection for the underlying substrate during etching.

Etching refers to a step of utilizing chemical agents to remove the uppermost layer of the substrate in the areas that are not protected by the remaining photoresist. Upon completion of the etching process, the remaining photoresist and anti-reflective coating are no longer needed and must be removed from the substrate. The photoresist may be removed utilizing plasma ashing, in which a plasma containing oxygen is used to oxidize the photoresist. Deionized (DI) water may be used subsequently for DI water cleaning. However, plasma ashing processes may damage refractory gate metals such as TiN, TaN and high-k dielectrics such as $HfO_2$ or HfSiOx.

Furthermore, removal of the photoresist may be difficult in areas that have been exposed to electron beam (ebeam) bombardment as a result of polymer cross-linking (e.g., if the substrate has been exposed to a post-lithography critical dimension scanning electron microscopy (CDSEM) metrology step and has been exposed to localized areas of ebeam dosing).

Alternatively, a liquid photoresist removing solvent may be utilized to chemically alter the photoresist so that it no longer adheres to the substrate. Such removal processes are referred to as wet processes. However, a requirement for a reduction in the environmental safety and health (ESH) impact of such solvents has changed. For instance, N-methyl-pyrrolidone (NMP), solvent used in photoresist and BARC removal, could be classified as reprotoxic.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiments of the invention, examples of which are illustrated in the accompanying drawings.

The present disclosure is directed to a composition and method for removing photoresist and BARC in a front end of line process. A nontoxic composition and a wet process is disclosed that is capable of removing both photoresist and BARC from a semiconductor substrate without damaging the refractory gate metals such as TiN, TaN and high-k dielectrics. In addition, the composition and the wet process is capable of removing both photoresist and BARC on the substrate in a relatively short amount of time.

Figure 1:
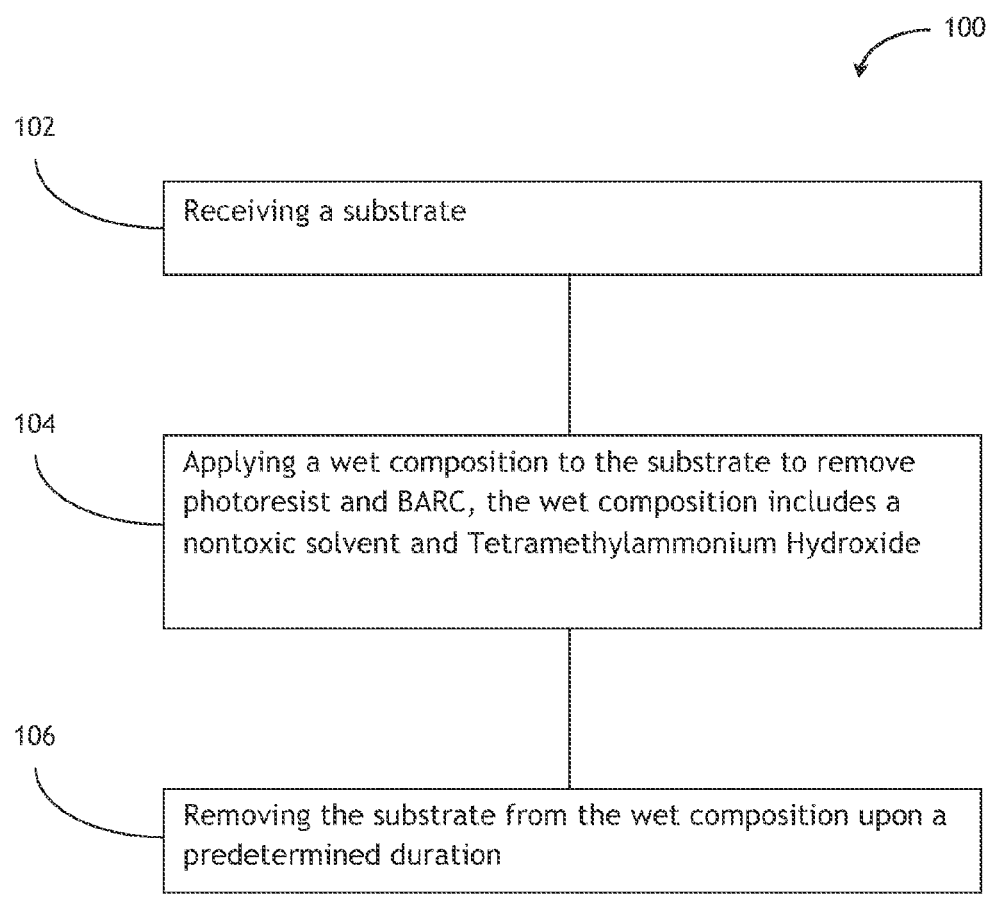
FIG. 1 is a flow diagram illustrating a method for removing photoresist and BARC in a front end of line process.

FIG. 1 shows a flow diagram illustrating steps performed by a method 100 for removing photoresist and BARC from a semiconductor substrate in a front end of line process. Step 102 may receive the substrate with photoresist and/or BARC that need to be removed. Step 104 may apply a composition to the substrate to dissolve the photoresist and BARC within approximately 1 minute or less. The substrate may be removed from the composition in step 106 once the photoresist and BARC are removed.

Figure 2:
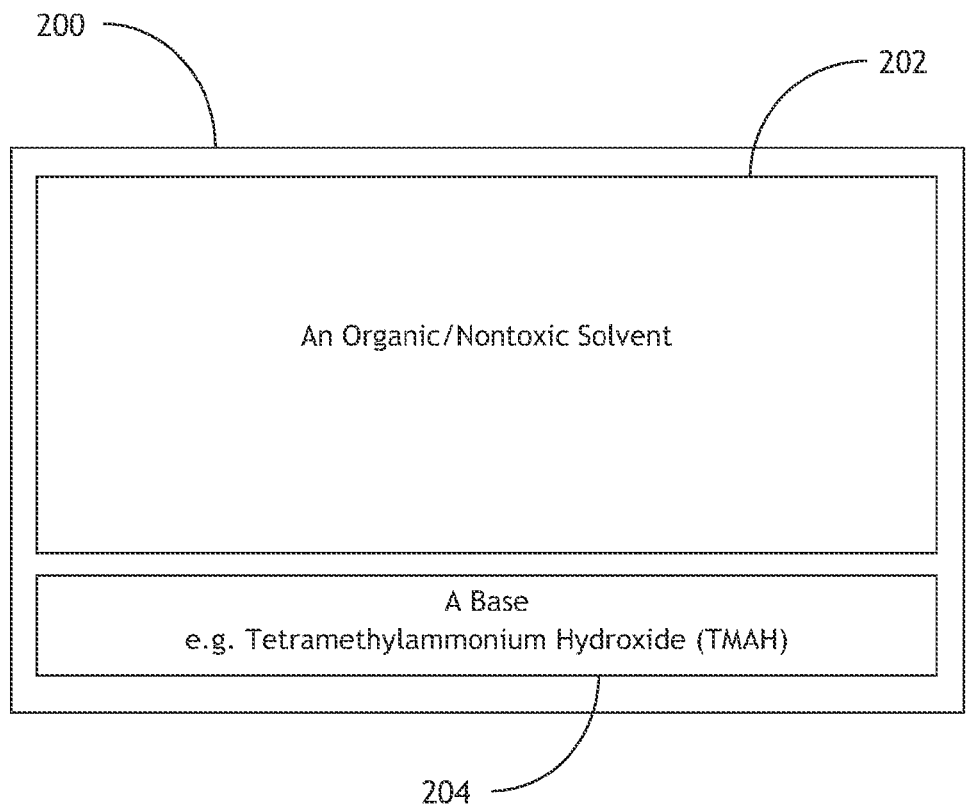
FIG. 2 is a block diagram illustrating a composition including an organic and nontoxic solvent and Tetramethylammonium Hydroxide (TMAH).

Referring to FIG. 2, an illustration depicting the composition 200 of the present disclosure is shown. The composition 200 includes a blend of organic solvents 202 that has an appropriate concentration of a strong base 204 and/or an oxidant. The solvent blend may dissolve photoresist and BARC within approximately 1 minute or less without attacking refractory metal or a high-k oxide of a semiconductor. Furthermore, a solvent blend with short process time also means that a single wafer wet tool may be utilized for resists removals.

The composition 200 is also capable of removing electron beam (ebeam) hardened resist for areas of the semiconductor that may have been exposed to ebeams as a result of polymer cross-linking. For example, the semiconductor substrate may be exposed to a post-lithography critical dimension scanning electron microscopy (CDSEM) metrology, which may expose the substrate to localized areas of electron beams and harden the photoresist that remains on the substrate. The ebeam hardened photoresist may be difficult to remove utilizing plasma ashing. However, the composition 200 of the present disclosure is capable of removing ebeam hardened photoresist efficiently.

In one embodiment, the materials (chemical formulations) of solvent 202 may be selected based on their Hansen Solubility parameters. The selected materials may be nontoxic (e.g., based on ESH criteria), having high flash points (e.g., above 80 degrees Celsius) and capable of dissolving both acrylic polymer and phenolic polymer. In addition, the selected materials for solvent 202 may be selected based on their efficiencies in dissolving photoresist materials such as ultraviolet photoresist. Furthermore, the selected materials for solvent 202 may have high polarity and may be required to mix well with water. For instance, a suitable material for solvent 202 may be N-(2-Hydroxyethyl)-2-Pyrrolidone (NHEP), Diethylene Glycol Monomethyl Ether (DEGME), or Dimethyl Sulfoxide (DMSO).

Base 204 may be added to the solvent 202 for BARC removal. The mixture of the solvent 202 and the base 204 may produce a composition 200 having a pH less than approximately 9. In one embodiment, Tetramethylammonium Hydroxide (TMAH) is utilized as the base 204. The concentration of TMAH in the composition 200 is specifically blended so that the composition 200 does not attack the refractory metal such as TiN and TaN or the high k material such as HfOx or HfSiOx during the resist-removal process.

TMAH is a quaternary ammonium salt with the molecular formula $(CH_3)_4NOH$. It is a phase transfer catalysis that facilitates acceleration of the reaction from one phase into another phase where reaction occurs. In the presence of TMAH, ionic reactants are easily soluble in the organic solvent 202. The amount and concentration of TMAH may be optimized to selectively etch BARC layer but not over etch the gate metals such as TiN, TaN and high dielectric such as HfOx or HfSiOx.

For instance, if NHEP is utilized as the solvent 202, then the addition of TMAH to NHEP produces a composition 200 (having a concentration of approximately 2.5% of TMAH by volume) that may allow the composition 200 to dissolve both photoresist and BARC on the semiconductor within 1 minute or less. In another example, if DEGME is utilized as the organic solvent, then the addition of TMAH to DEGME produces another composition 200 (having a concentration of no more than approximately 2.5% of TMAH by volume) that may dissolve both photoresist and BARC on the semiconductor within 1 minute or less at the temperature of approximately 50 degrees Celsius. In still another example, if DMSO is utilized as the organic solvent, then the addition of TMAH to DMSO produces still another composition 200 (having a concentration of no more than approximately 2.5% of TMAH by volume) that may dissolve both photoresist and BARC on the semiconductor within approximately 1 minute or less at the temperature of approximately 60 degrees Celsius.

The effectiveness and the optimal chemical formulations of the composition of the present disclosure may be tested and determined utilizing a high throughput approach. To reduce the number of substrates used for testing and product development, the etch rates of all the films of interest may be tested on blanket substrates by varying the process condition. This may include testing the etch rates on photoresist, BARC, the underlying refractory material, and the high-k. The composition being tested may include various types of solvent and formulations mixed with different concentrations of base (TMAH). In addition, the tests may be conducted under different testing conditions, such as varying temperatures and varying agitation to the composition fluid (e.g. stirrer speed). In one embodiment, a high productivity combinatorial (HPC) system may be utilized to quickly generate a set of libraries for the various compositions being tested. An exemplary HPC system is disclosed in: Combinatorial Process System, U.S. patent application Ser. No. 12/027,980, which is herein incorporated by reference in its entirety. Furthermore, the effectiveness of removing ebeam or CDSEM hardened photoresist utilizing the composition of the present disclosure is also tested. For example, the CDSEM hardened photoresist may be reproduced for testing purposes utilizing a flood gun dose that matches the CDSEM dose on a real product substrate.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method comprising:
   providing a high productivity combinatorial (HPC) system;
   receiving a substrate into the HPC system, the substrate comprising multiple site-isolated regions;
   applying a composition to one of the site-isolated regions on the substrate, the composition comprising:
   a nontoxic solvent capable of dissolving acrylic polymer and phenolic polymer, wherein the nontoxic solvent is one of N-(2-Hydroxyethyl)-2-Pyrrolidone, or Diethylene Glycol Monomethyl Ether; and
   Tetramethylammonium Hydroxide (TMAH) mixed with the nontoxic solvent; and removing the composition from the substrate.

2. The method of claim 1, further comprising repeating the applying operation on one or more remaining site-isolated regions.

3. The method of claim 2, wherein the applying operation is repeated using a different testing condition.

4. The method of claim 3, wherein the applying operation is repeated using different temperatures of the composition.

5. The method of claim 3, wherein the applying operation is repeated using different agitation conditions.

6. The method of claim 1, wherein the substrate comprises a refractory metal layer, a photoresist layer, and a bottom anti-reflective coating layer.

7. The method of claim 6, wherein the refractory metal layer comprises one of titanium nitride, or tantalum nitride.

8. The method of claim 6, wherein the bottom anti-reflective coating layer is disposed over the refractory metal layer.

9. The method of claim 6, wherein the photoresist layer is disposed over the bottom anti-reflective coating layer.

10. The method of claim 6, further comprising removing the composition from the substrate, wherein, after removing the composition, the photoresist layer and the bottom anti-reflective coating layer are removed from the substrate while the refractory metal layer remains on the substrate and is not damaged by the composition.

11. The method of claim 1, wherein the TMAH mixed with the nontoxic solvent provides the composition having a concentration of approximately 2.5% of TMAH by volume.

12. The method of claim 1, wherein the nontoxic solvent is Diethylene Glycol Monomethyl Ether.

13. The method of claim 12, wherein the TMAH mixed with the nontoxic solvent provides the composition having a concentration of no more than approximately 2.5% of TMAH by volume.

14. The method of claim 1, wherein the composition is removed from the substrate after less than or equal to approximately one minute.

15. The method of claim 1, wherein the substrate comprises an e-beam hardened photoresist and wherein the e-beam hardened photoresist is removed from the substrate during the applying operation.

16. The method of claim 1, further comprising repeating the applying operation using one or more remaining site-isolation regions, wherein different compositions are used for different site isolated regions.

17. The method of claim 16, wherein the different compositions have different Hansen Solubility parameters.

* * * * *